(12) United States Patent
Han

(10) Patent No.: US 10,134,329 B2
(45) Date of Patent: Nov. 20, 2018

(54) AMOLED PIXEL DRIVER CIRCUIT AND PIXEL DRIVING METHOD

(71) Applicant: Shenzhen China Star Optoelectronics Technology Co., Ltd., Shenzhen (CN)

(72) Inventor: Baixiang Han, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 97 days.

(21) Appl. No.: 15/328,497

(22) PCT Filed: Dec. 19, 2016

(86) PCT No.: PCT/CN2016/110723
§ 371 (c)(1),
(2) Date: Jan. 24, 2017

(87) PCT Pub. No.: WO2018/045667
PCT Pub. Date: Mar. 15, 2018

(65) Prior Publication Data
US 2018/0226018 A1    Aug. 9, 2018

(30) Foreign Application Priority Data

Sep. 9, 2016 (CN) .......................... 2016 1 0816133

(51) Int. Cl.
*G09G 3/3225* (2016.01)
*H01L 27/32* (2006.01)
(Continued)

(52) U.S. Cl.
CPC ......... *G09G 3/3225* (2013.01); *G09G 3/3233* (2013.01); *G09G 3/3266* (2013.01); *H01L 27/3244* (2013.01); *G09G 2300/0417* (2013.01); *G09G 2300/0819* (2013.01); *G09G 2300/0842* (2013.01); *G09G 2310/0251* (2013.01); *G09G 2310/0262* (2013.01); *G09G 2310/0264* (2013.01); *G09G 2320/043* (2013.01)

(58) Field of Classification Search
CPC ......... G09G 3/3225; G09G 2310/0264; G09G 3/3266; G09G 3/3233; G09G 2320/043; G09G 2310/0262; G09G 2300/0417; G09G 2310/0251; G09G 2300/0842; G09G 2300/0819; H01L 27/3244
See application file for complete search history.

(56) References Cited

U.S. PATENT DOCUMENTS

2016/0071458 A1* 3/2016 Tan ...................... G09G 3/3233
                                                         345/212

FOREIGN PATENT DOCUMENTS

CN          102930822 A     2/2013

* cited by examiner

*Primary Examiner* — Abhishek Sarma
(74) *Attorney, Agent, or Firm* — Leong C. Lei

(57) ABSTRACT

The invention provides an AMOLED pixel driver circuit and pixel driving method, by using a pixel driver circuit of 5T1C structure to effectively compensate threshold voltage of driving TFT in each pixel through a source-following approach to compensate the threshold voltage of the driving TFT so that the current flowing through the OLED is independent of the threshold voltage of the first TFT, the threshold voltage of the OLED and the negative voltage of the power source to ensure even light-emission result of OLED and improve display result.

14 Claims, 5 Drawing Sheets

(51) Int. Cl.
*G09G 3/3233* (2016.01)
*G09G 3/3266* (2016.01)

AMOLED PIXEL DRIVER CIRCUIT AND PIXEL DRIVING METHOD

BACKGROUND OF THE INVENTION

1. Field of the Invention

The present invention relates to the field of display techniques, and in particular to an AMOLED pixel driver and pixel driving method.

2. The Related Arts

The organic light emitting diode (OLED) display provides the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

The driving types of OLED can be divided, according to the driving method, into the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

AMOLED is a current-driven device that emits light when a current flows through the OLED, and the light-emitting luminance is determined by the current flowing through the OLED. Most of the known integrated circuits (ICs) only transmit voltage signals, so the AMOLED pixel driver circuit needs to complete the task of converting the voltage signal into a current signal. The known AMOLED pixel driver circuit is usually 2T1C structure, that is, two thin film transistors (TFTs) and a capacitor, to convert voltage to current, but the traditional 2T1C pixel driver circuit generally does not provide a compensation function.

As shown in FIG. 1, a known 2T1C pixel driver circuit for AMOLED with a compensation function comprises a first TFT T10, a second TFT T20, and a capacitor Cs, wherein the first TFT T10 is a switching TFT, the second TFT T20 is a driving TFT, and the capacitor C10 is a storage capacitor. Specifically, the gate of the first TFT T10 is electrically connected to the scan signal Scan, the source connected to the data signal Data, and the drain connected to the gate of the second TFT T20 and one end of the capacitor C10; the drain of the second TFT T20 is electrically connected to the power supply positive voltage VDD, the source connected to the anode of the OLED D; the cathode of the OLED D is electrically connected to the power supply negative voltage VSS; one end of the capacitor C10 is electrically connected to the drain of the first TFT T10, and the gate of the second TFT T20, and the other end connected to the source of the second TFT T20 and the power supply negative voltage VSS. When the AMOLED displays, the scan signal Scan turns on the first TFT T10, the data signal Data enters the gate of the second TFT T20 and the capacitor C10 via the first TFT T10. Then, the first TFT T10 is cut off. Due to the storage effect of the capacitor C10, the gate voltage of the second TFT T20 is maintained at the voltage of the data signal so that the second TFT T20 stays conductive to drive the current flowing through the second TFT T20 to enter the OLED D to drive the OLED D to emit light.

The known 2T1C pixel driver circuit used for AMOLED is sensitive to the threshold voltage and channel migration ratio of the thin film transistor, the starting voltage and quantum efficiency of the OLED, and the transient process of the power supply. The threshold voltage of the second TFT T20, that is, the driving TFT, drifts with the operation time, resulting in unstable light emission of the OLED D. Furthermore, the drift of threshold voltage of the second driving TFT T20 (that is, the driving TFT) of the pixel driver circuit of each pixel is different, i.e., increase or decrease, which results in the uneven light emission and the different brightness among the pixels. The use of this known 2T1C pixel driver circuit with no compensation results in 50% unevenness or more in AMOLED display brightness.

One approach to solve AMOLED display brightness unevenness is to add compensation circuit to each pixel, which means the compensation must be made for the parameters of the driving TFT, such as the threshold voltage and the migration ratio, in each pixel so that the current flowing through the OLED becomes independent of these parameters.

SUMMARY OF THE INVENTION

The object of the present invention is to provide an AMOLED pixel driver circuit, able to effectively compensate the threshold voltage change of the driving TFT to stabilize the current flowing through the OLED and to ensure even light-emitting of the OLED to improve display result.

Another object of the present invention is to provide an AMOLED pixel driving method, able to effectively compensate the threshold voltage change of the driving TFT to solve the problem of unable current flowing through the OLED caused by the threshold voltage drift so as to ensure even light-emitting of the OLED to improve display result.

To achieve the above object, the present invention provides an AMOLED driver circuit, which comprises: a first thin film transistor (TFT), a second TFT, a third TFT, a fourth TFT, a fifth TFT, a capacitor, and an organic light-emitting diode (OLED);

the first TFT having the gate connected to a first node, the source connected to positive voltage of a power supply and the drain connected to a second node;

the second TFT having the gate connected to a first scan signal, the source connected to a reference voltage and the drain connected to a third node;

the third TFT having the gate connected to a second scan signal, the source connected to the second node and the drain connected to an initialization voltage;

the fourth TFT having the gate connected to the first scan signal, the source connected to a data signal and the drain connected to the first node;

the capacitor having one end connected to the third node and the other end connected to the second node;

the OLED having the anode connected to the second node and the cathode connected to negative terminal of the power supply;

the fifth TFT having the gate connected to a light-emitting control signal, the source connected to the first node and the drain connected to the third node;

when the fifth TFT being turned on, the second TFT and the fourth TFT being cut off; and when the fifth TFT being cut off, the second TFT and the fourth TFT being turned on.

According to a preferred embodiment of the present invention, the first TFT, the second TFT, the third TFT, the fourth TFT and the fifth TFT are all of the same type, that is, either N-type TFTs or P-type TFTs; the light-emitting control signal is a first inverted scan signal, the first inverted scan signal and the first scan signal have opposite phases.

According to a preferred embodiment of the present invention, the first TFT, the second TFT, the third TFT and the fourth TFT are all of the same type, that is, either N-type TFTs or P-type TFTs, while the fifth TFT is of a different type from the first, second, third and fourth TFTs, i.e., P-type or N-type; and the light-emitting control signal is the first inverted scan signal.

According to a preferred embodiment of the present invention, the driving timing sequences of the AMOLED pixel driver circuit comprises: an initialization phase, a threshold voltage compensation phase and a light-emitting phase.

According to a preferred embodiment of the present invention, in the initialization phase, the first scan signal turns on the second TFT and the fourth TFT, the light-emitting control signal cuts off the fifth TFT, and the second scan signal turns on the third TFT;

in the threshold voltage compensation phase, the first scan signal turns on the second TFT and the fourth TFT, the light-emitting control signal cuts off the fifth TFT, and the second scan signal cuts off the third TFT;

in the light-emitting phase, the first scan signal cuts off the second TFT and the fourth TFT, the light-emitting control signal turns on the fifth TFT, and the second scan signal cuts off the third TFT.

According to a preferred embodiment of the present invention, the first TFT, the second TFT, the third TFT, the fourth TFT and the fifth TFT are all low temperature polysilicon (LTPS) TFTs, oxide semiconductor TFTs or amorphous silicon (a-Si) TFTs.

Another embodiment of the present invention provides an AMOLED pixel driving method, which comprises:

Step 1: providing an AMOLED pixel driver circuit, comprising: a first thin film transistor (TFT), a second TFT, a third TFT, a fourth TFT, a fifth TFT, a capacitor, and an organic light-emitting diode (OLED);

the first TFT having the gate connected to a first node, the source connected to positive voltage of a power supply and the drain connected to a second node;

the second TFT having the gate connected to a first scan signal, the source connected to a reference voltage and the drain connected to a third node;

the third TFT having the gate connected to a second scan signal, the source connected to the second node and the drain connected to an initialization voltage;

the fourth TFT having the gate connected to the first scan signal, the source connected to a data signal and the drain connected to the first node;

the capacitor having one end connected to the third node and the other end connected to the second node;

the OLED having the anode connected to the second node and the cathode connected to negative terminal of the power supply;

the fifth TFT having the gate connected to a light-emitting control signal, the source connected to the first node and the drain connected to the third node;

Step 2: entering initialization phase: the first scan signal turning on the second TFT and the fourth TFT, the light-emitting control signal cutting off the fifth TFT, and the second scan signal turning on the third TFT, the data signal being written into the first node, the initialization signal being written into the second node, and the reference voltage being written into the third node;

Step 3: entering threshold voltage detection phase, the first scan signal turning on the second TFT and the fourth TFT, the light-emitting control signal cutting off the fifth TFT, and the second scan signal cutting off the third TFT, the first node remaining at the data signal voltage, the second ndoe changing to the voltage difference between the data signal and the threshold voltage of the first TFT, the third node remaining at the reference voltage, and the two ends of the capacitor storing the voltage difference between the reference voltage and the second node;

Step 4: entering threshold voltage compensation phase, the first scan signal cutting off the second TFT and the fourth TFT, the light-emitting control signal turning on the fifth TFT, and the second scan signal cutting off the third TFT, the first node and the third node being connected, the voltage between the two ends of the capacitor remaining unchanged, the OLED emitting light and the current flowing through the OLED being independent of the threshold voltage of the first TFT, the threshold voltage of the OLED and the negative voltage of the power source.

According to a preferred embodiment of the present invention, the first TFT, the second TFT, the third TFT, the fourth TFT and the fifth TFT are all of the same type, that is, either N-type TFTs or P-type TFTs; the light-emitting control signal is a first inverted scan signal, the first inverted scan signal and the first scan signal have opposite phases.

According to a preferred embodiment of the present invention, the first TFT, the second TFT, the third TFT and the fourth TFT are all of the same type, that is, either N-type TFTs or P-type TFTs, while the fifth TFT is of a different type from the first, second, third and fourth TFTs, i.e., P-type or N-type; and the light-emitting control signal is the first inverted scan signal.

According to a preferred embodiment of the present invention, the first TFT, the second TFT, the third TFT, the fourth TFT and the fifth TFT are all low temperature polysilicon (LTPS) TFTs, oxide semiconductor TFTs or amorphous silicon (a-Si) TFTs.

Yet another embodiment of the present invention provides an AMOLED driver circuit, which comprises: a first thin film transistor (TFT), a second TFT, a third TFT, a fourth TFT, a fifth TFT, a capacitor, and an organic light-emitting diode (OLED);

the first TFT having the gate connected to a first node, the source connected to positive voltage of a power supply and the drain connected to a second node;

the second TFT having the gate connected to a first scan signal, the source connected to a reference voltage and the drain connected to a third node;

the third TFT having the gate connected to a second scan signal, the source connected to the second node and the drain connected to an initialization voltage;

the fourth TFT having the gate connected to the first scan signal, the source connected to a data signal and the drain connected to the first node;

the capacitor having one end connected to the third node and the other end connected to the second node;

the OLED having the anode connected to the second node and the cathode connected to negative terminal of the power supply;

the fifth TFT having the gate connected to a light-emitting control signal, the source connected to the first node and the drain connected to the third node;

when the fifth TFT being turned on, the second TFT and the fourth TFT being cut off; and when the fifth TFT being cut off, the second TFT and the fourth TFT being turned on;

wherein the driving timing sequences of the AMOLED pixel driver circuit comprising: an initialization phase, a threshold voltage compensation phase and a light-emitting phase;

wherein the first TFT, the second TFT, the third TFT, the fourth TFT and the fifth TFT being all low temperature polysilicon (LTPS) TFTs, oxide semiconductor TFTs or amorphous silicon (a-Si) TFTs.

Compared to the known techniques, the present invention provides the following advantages. The present invention provides an AMOLED pixel driver circuit and pixel driving method, by using a pixel driver circuit of 5T1C structure to effectively compensate threshold voltage of driving TFT in each pixel through a source-following approach to compensate the threshold voltage of the driving TFT so that the current flowing through the OLED is independent of the threshold voltage of the first TFT, the threshold voltage of the OLED and the negative voltage of the power source to ensure even light-emission result of OLED and improve display result.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
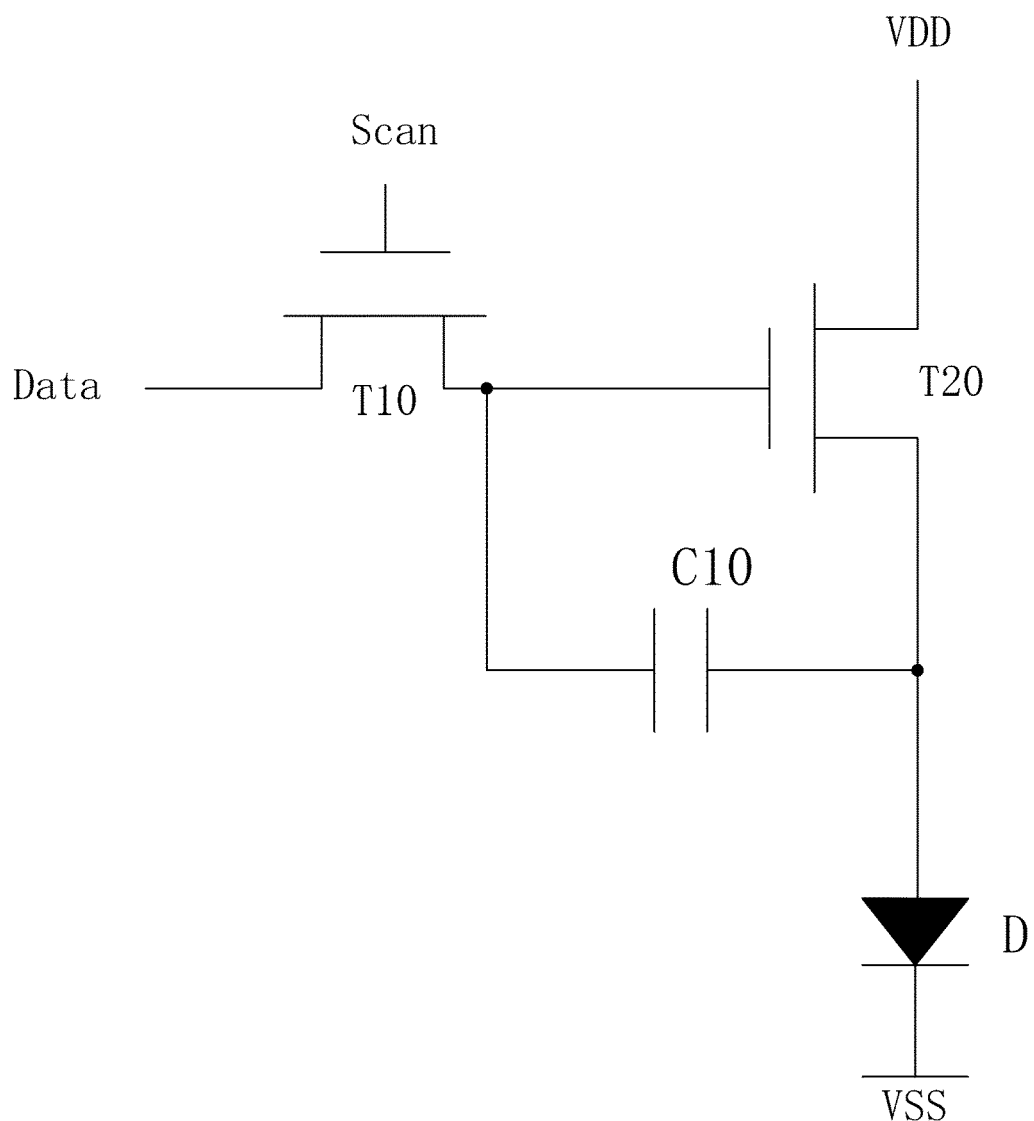
FIG. 1 is a schematic view showing a known 2T1C pixel driver circuit for AMOLED.
Figure 2:
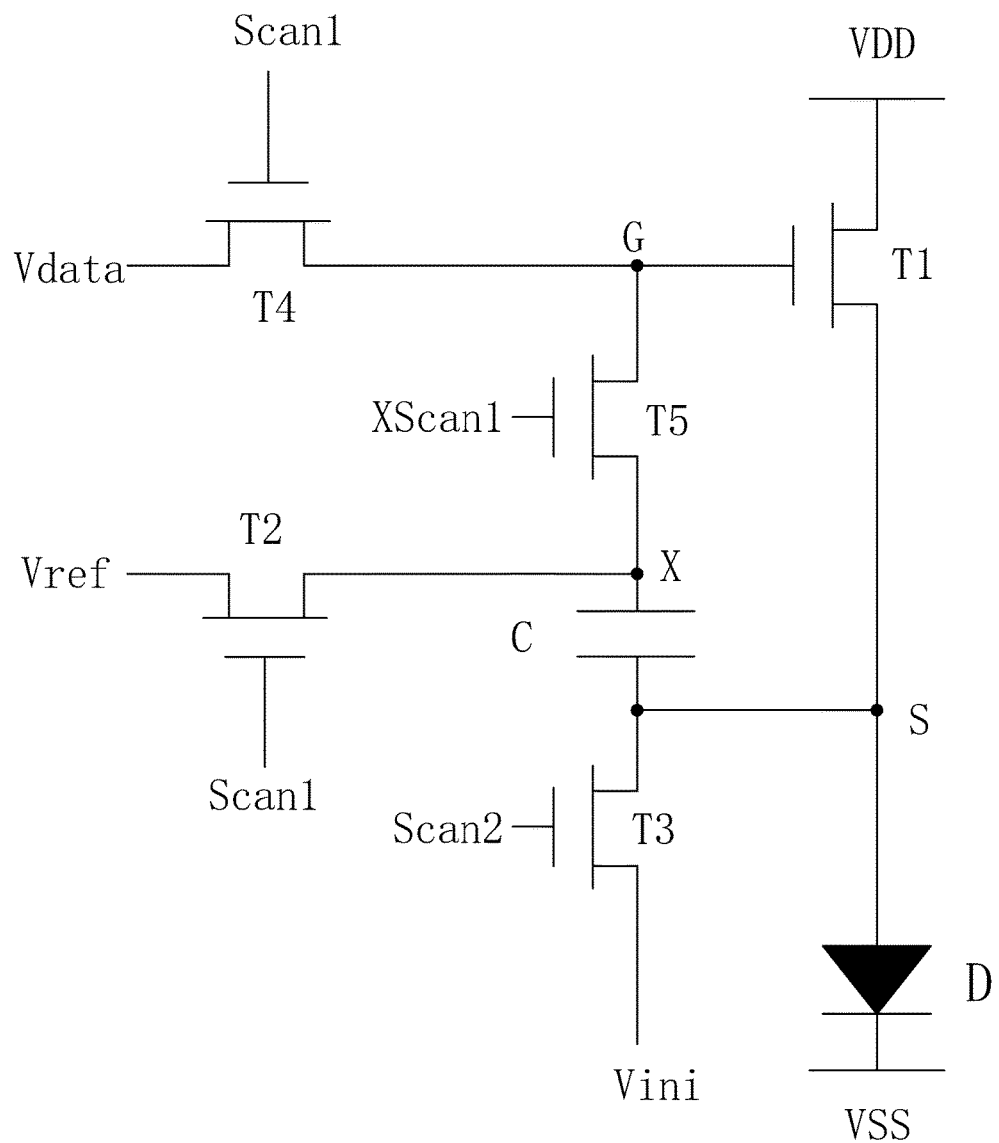
FIG. 2 is a schematic view showing a pixel driver circuit for AMOLED provided by the first embodiment of the present invention.
Figure 4:
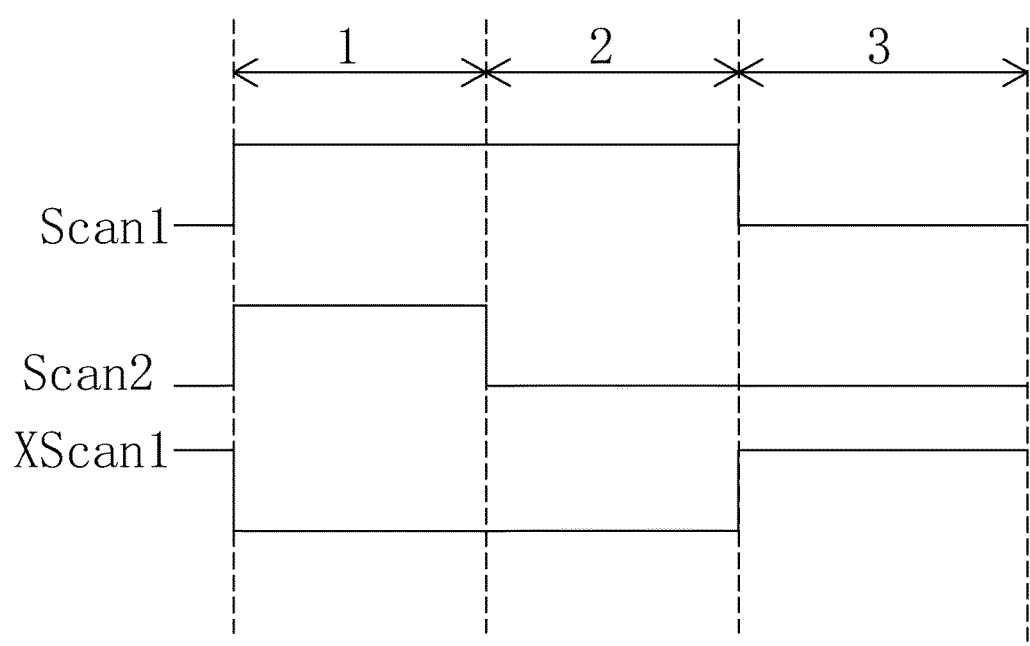
FIG. 4 is a schematic view showing the timing sequence of the pixel driver circuit provided by the first embodiment of the present invention.

Referring to FIG. 2 and FIG. 4, the present invention provides the first embodiment of an AMOLED pixel driver circuit of 5T1C structure, which comprises: a first thin film transistor (TFT) T1, a second TFT T2, a third TFT T3, a fourth TFT T4, a fifth TFT T5, a capacitor C, and an organic light-emitting diode (OLED) D.

Wherein, the first TFT T1 has the gate connected to a first node G, the source connected to positive voltage of a power supply VDD and the drain connected to a second node S; the second TFT T2 has the gate connected to a first scan signal Scan1, the source connected to a reference voltage Vref and the drain connected to a third node X; the third TFT T3 has the gate connected to a second scan signal Scan2, the source connected to the second node S and the drain connected to an initialization voltage Vini, the fourth TFT T4 has the gate connected to the first scan signal Scan1, the source connected to a data signal Vdata and the drain connected to the first node G; the capacitor C has one end connected to the third node X and the other end connected to the second node S; the OLED D has the anode connected to the second node S and the cathode connected to negative terminal of the power supply VSS; the fifth TFT T5 has the gate connected to a light-emitting control signal, the source connected to the first node G and the drain connected to the third node X. In this the instant embodiment, the light-emitting control signal is a first inverted scan signal Xscan1, the first inverted scan signal Xscan1 and the first scan signal Scan1 have opposite phases.

Specifically, the first TFT, the second TFT, the third TFT, the fourth TFT and the fifth TFT are all low temperature polysilicon (LTPS) TFTs, oxide semiconductor TFTs or amorphous silicon (a-Si) TFTs.

Furthermore, refer to FIG. 4. The timing sequence of the first embodiment of the AMOLED pixel driver circuit of the present invention comprises the following phases: an initialization phase 1, a threshold voltage compensation phase 2 and a light-emitting phase 3; wherein, in the initialization phase 1, the first scan signal Scan1 turns on the second TFT T2 and the fourth TFT T4 by providing a high level voltage, the first inverted scan signal Xscan1 cuts off the fifth TFT T5 by providing a low level voltage, and the second scan signal Scan2 turns on the third TFT T3 by providing a high level voltage; in the threshold voltage compensation phase 2, the first scan signal Scan1 turns on the second TFT T2 and the fourth TFT T4 by providing a high level voltage, the first inverted scan signal Xscan1 cuts off the fifth TFT T5 by providing a low level voltage, and the second scan signal Scan2 cuts off the third TFT by providing a low level voltage; in the light-emitting phase 3, the first scan signal Scan1 cuts off the second TFT T2 and the fourth TFT T4 by providing a low level voltage, the first inverted scan signal Xscan1 turns on the fifth TFT T5 by providing a high level voltage, and the second scan signal Scan2 cuts off the third TFT T3 by providing a low level voltage.

It should be noted that in the initialization phase 1, the threshold voltage compensation phase 2 and the light-emitting phase 3, the voltage changes of the first node G, the second node S and the third node X, and the compensation process of the OLED D are as follows: in the initialization phase 1, the data signal voltage Vdata is written into the first node G, the initialization voltage Vini is written into the second node S, and the reference voltage Vref is written into the third node X; in the threshold voltage compensation phase 2, the voltages at the first node G and the third node X remain the unchanged as the data signal voltage Vdata and reference voltage Vref respectively, the voltage of the second node S is raised to the voltage difference Vdata−Vth1 between the data signal voltage Vdata and the threshold voltage of the first TFT T1 because the third TFT T3 is cut off, wherein the Vth1 is the threshold voltage of the first TFT T1, so that the voltages stored at the two ends of the capacitor C is the voltage difference of the third node X and the second node S, i.e., Vref−(Vdata−Vth1); in the light-emitting phase 3, the fifth TFT T5 is turned on to make the first node connected to the third node X, and the voltages stored at the two ends of the capacitor C remains as Vref−(Vdata−Vth1), which is the gate voltage of the first TFT T1, that is, the driving TFT.

Furthermore, the equation to compute the current flowing through the OLED D is:

$$I = \frac{1}{2} C_{ox}(\mu W/L)(V_{gs} - V_{th})^2 \quad (1)$$

Wherein I is the current flowing through the OLEDD, μ is the carrier migration rate of the driving TFT, W and L are the width and length of channel of the driving TFT, Vgs is the voltage difference between the gate and the source of the driving TFT, and Vth is the threshold voltage of the driving TFT. In the present invention, the threshold voltage Vth of the driving TFT is the threshold voltage Vth1 of the first TFT T1. However:

$$Vgs = Vref - (Vdata - Vth1) \quad (2)$$

By substituting (2) into (1), the following is obtained:

$$I = 1/2Cox(\mu W/L)(Vth1 + Vref - Vdata - Vth1)^2$$
$$= 1/2Cox(\mu W/L)(Vref - Vdata)^2$$

As shown, the current I flowing through the OLED D is independent of the threshold voltage of the first TFT T1, the threshold voltage of the OLED D and the negative voltage of the power supply VSS, which realizes the compensation function so as to effectively compensate the threshold voltage change of the driving TFT (i.e., the first TFT T1) and the OLED D so that the AMOLED light-emission is uniform and the display quality is improved.

Figure 3:
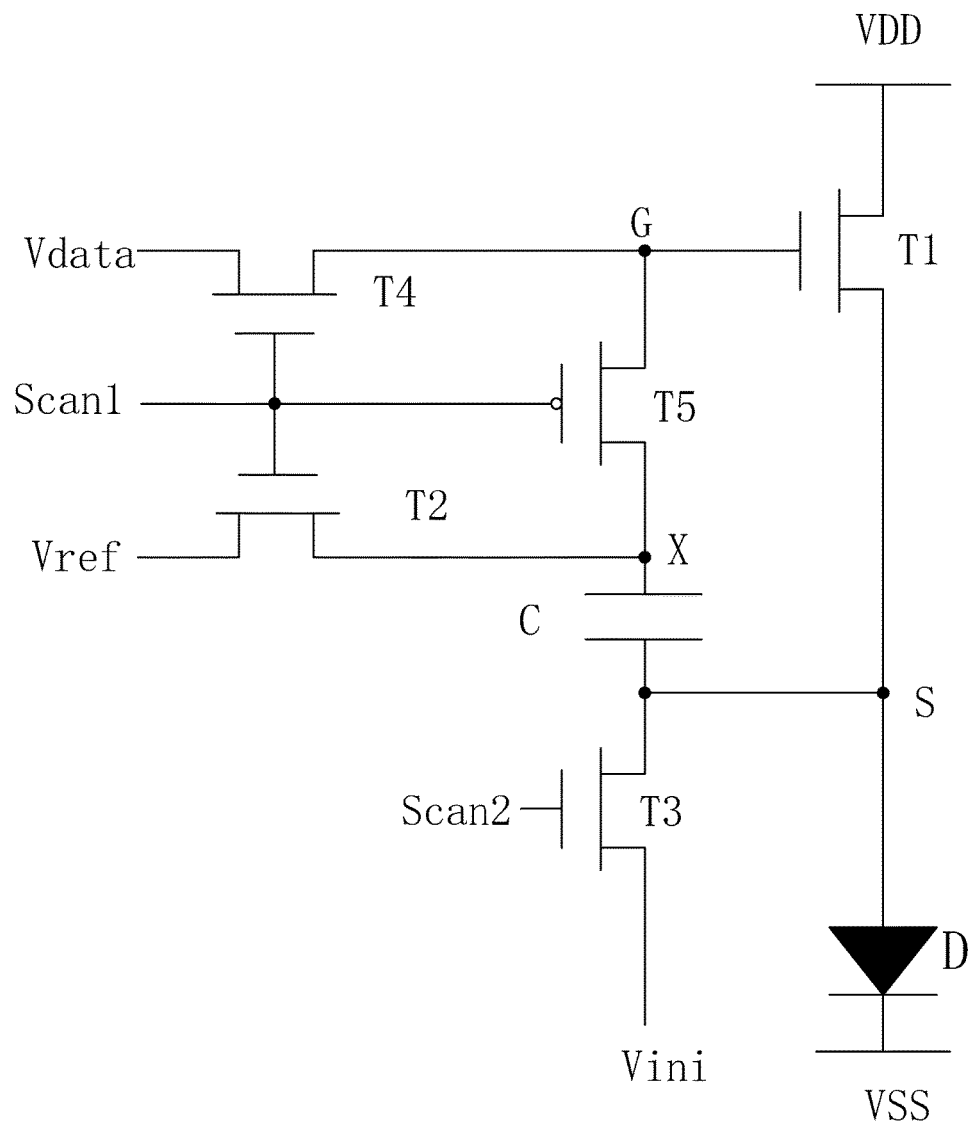
FIG. 3 is a schematic view showing a pixel driver circuit for AMOLED provided by the second embodiment of the present invention.
Figure 5:
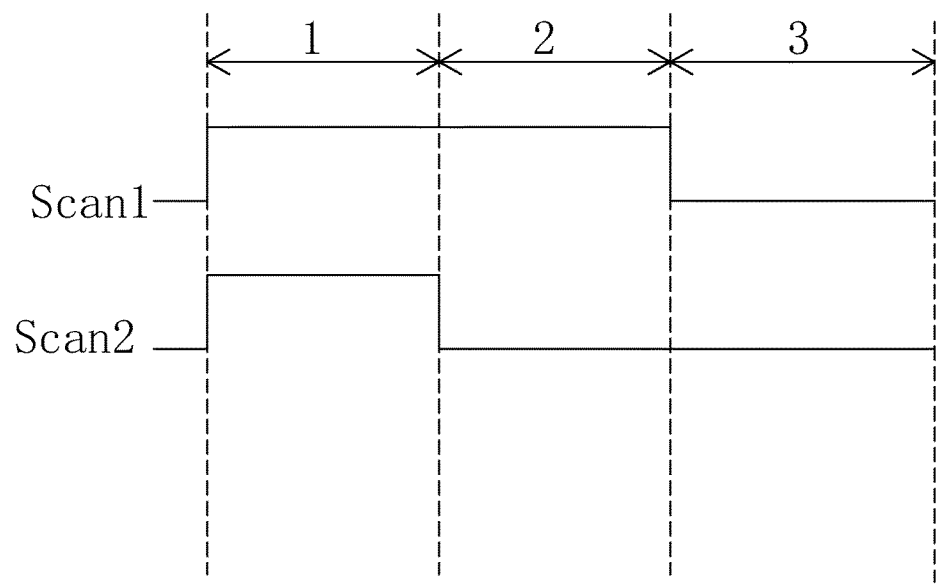
FIG. 5 is a schematic view showing the timing sequence of the pixel driver circuit provided by the second embodiment of the present invention.

Refer to FIG. 3 and FIG. 5. FIG. 3 is the second embodiment of the present invention. Compared to the first embodiment, in the instant embodiment, the fifth TFT T5 is a P-type TFT and uses the first scan signal Scan1 as the light-emitting control signal to connect to the gate of the fifth TFT T5. The remaining of the embodiment is the same as the first embodiment, and the detailed description will not be repeated here.

It should be understood that the present invention is not limited to the first and the second embodiments. In other embodiments, the first TFT T1, the second TFT T2, the third TFT T3, the fourth TFT T4 and the fifth TFT T5 are all P-type TFTs; alternatively, the first TFT T1, the second TFT T2, the third TFT T3 and the fourth TFT T4 are all P-type TFTs, while the fifth TFT T5 is an N-type TFT. In these embodiments, the adequate signals can be used to achieve the realization of the present invention.

Based on the aforementioned AMOLED pixel driver circuit, the present invention also provides an AMOLED pixel driving method, which comprises the following steps:

Step 1: providing an AMOLED pixel driver circuit of any of the above embodiments.

Step 2: entering initialization phase 1: the first scan signal Scan1 turning on the second TFT T2 and the fourth TFT T4, the light-emitting control signal cutting off the fifth TFT T5, and the second scan signal Scan2 turning on the third TFT T3, the data signal Vdata being written into the first node G, the initialization signal Vini being written into the second node S, and the reference voltage Vref being written into the third node X.

Step 3: entering threshold voltage detection phase 2: the first scan signal Scan1 turning on the second TFT T2 and the fourth TFT T4, the light-emitting control signal cutting off the fifth TFT T5, and the second scan signal Scan2 cutting off the third TFT T3, the first node G remaining at the data signal voltage Vdata, the second node S changing to the voltage difference between the data signal Vdata and the threshold voltage of the first TFT T1, the third node X remaining at the reference voltage Vref, and the two ends of the capacitor C storing the voltage difference between the reference voltage Vref and the second node S.

Step 4: entering threshold voltage compensation phase 3: the first scan signal Scan1 cutting off the second TFT T2 and the fourth TFT T4, the light-emitting control signal turning on the fifth TFT T5, and the second scan signal Scan2 cutting off the third TFT T3, the first node G and the third node X being connected, the voltage between the two ends of the capacitor C remaining unchanged, the OLED D emitting light and the current flowing through the OLED D being independent of the threshold voltage of the first TFT T1, the threshold voltage of the OLED D and the negative voltage of the power source VSS.

Specifically, based on the types of TFTs used in the AMOLED pixel driver circuit provided in Step 1, the first scan signal Scan1, the second scan signal Scan2, the light-emitting control signal must have the voltage level adjusted accordingly. Wherein, when the AMOLED pixel driver circuit provided in Step 1 is the circuit of the first embodiment shown in FIG. 2, the first TFT T1, the second TFT T2, the third TFT T3, the fourth TFT T4 and the fifth TFT T5 are all N-type TFTs, the first scan signal Scan1 is high level in the initialization phase 1 and the threshold voltage compensation phase 2 while low level in the light-emitting phase 3; the light-emitting control signal is a first inverted scan signal Xscan1, which has the phase opposite to the first scan signal Scan1; the second scan signal Scan2 is high level in the initialization phase 1, while low level in the threshold voltage compensation phase 2 and the light-emitting phase 3. When the AMOLED pixel driver circuit provided in Step 1 is the circuit of the second embodiment shown in FIG. 3, the first TFT T1, the second TFT T2, the third TFT T3 and the fourth TFT T4 are all N-type TFTs while the fifth TFT T5 is P-type TFT, the first scan signal and the light-emitting signal are the same signal; the first scan signal Scan1 is high level in the initialization phase 1 and the threshold voltage compensation phase 2 while low level in the light-emitting phase 3; the second scan signal Scan2 is high level in the initialization phase 1, while low level in the threshold voltage compensation phase 2 and the light-emitting phase 3. In addition, when the AMOLED pixel driver circuit provided in Step 1 is of other embodiments, for example, the first TFT T1, the second TFT T2, the third TFT T3, the fourth TFT T4 and the fifth TFT T5 are all P-type TFTs; or, the first TFT T1, the second TFT T2, the third TFT T3 and the fourth TFT T4 are all P-type TFTs, while the fifth TFT T5 is an N-type TFT, the first scan signal Scan1 and the second scan signal Scan2 in the first embodiment and the second embodiment must be inverted accordingly achieve the realization of the present invention.

Furthermore, the equation to compute the current flowing through the OLED D in Step 4 is:

$$I = \tfrac{1}{2}Cox(\mu W/L)(Vgs-Vth)^2 \quad (1)$$

Wherein I is the current flowing through the OLEDD, p is the carrier migration rate of the driving TFT, W and L are the width and length of channel of the driving TFT, Vgs is the voltage difference between the gate and the source of the driving TFT, and Vth is the threshold voltage of the driving TFT. In the present invention, the threshold voltage Vth of the driving TFT is the threshold voltage Vth1 of the first TFT T1. However:

$$Vgs = Vref - (Vdata - Vth1) \quad (2)$$

By substituting (2) into (1), the following is obtained:

$$I = 1/2Cox(\mu W/L)(Vth1 + Vref - Vdata - Vth1)^2$$
$$= 1/2Cox(\mu W/L)(Vref - Vdata)^2$$

As shown, the current I flowing through the OLED D is independent of the threshold voltage of the first TFT T1, the threshold voltage of the OLED D and the negative voltage of the power supply VSS, which realizes the compensation function so as to effectively compensate the threshold voltage change of the driving TFT (i.e., the first TFT T1) and the OLED D so that the AMOLED light-emission is uniform and the display quality is improved.

In summary, the present invention provides an AMOLED pixel driver circuit and pixel driving method, by using a pixel driver circuit of 5T1C structure to effectively compensate threshold voltage of driving TFT in each pixel through a source-following approach to compensate the threshold voltage of the driving TFT so that the current flowing through the OLED is independent of the threshold voltage of the first TFT, the threshold voltage of the OLED and the negative voltage of the power source to ensure even light-emission result of OLED and improve display result.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An active matrix organic light-emitting diode (AMOLED) pixel driver circuit, which comprises: a first thin film transistor (TFT), a second TFT, a third TFT, a fourth TFT, a fifth TFT, a capacitor, and an organic light-emitting diode (OLED);
   the first TFT having the gate connected to a first node, the source connected to positive voltage of a power supply and the drain connected to a second node;
   the second TFT having the gate connected to a first scan signal, the source connected to a reference voltage and the drain connected to a third node;
   the third TFT having the gate connected to a second scan signal, the source connected to the second node and the drain connected to an initialization voltage;
   the fourth TFT having the gate connected to the first scan signal, the source connected to a data signal and the drain connected to the first node;
   the capacitor having one end connected to the third node and the other end connected to the second node;
   the OLED having the anode connected to the second node and the cathode connected to negative terminal of the power supply;
   the fifth TFT having the gate connected to a light-emitting control signal, the source connected to the first node and the drain connected to the third node;
   wherein when the fifth TFT is turned on, the second TFT and the fourth TFT are cut off; and when the fifth TFT is cut off, the second TFT and the fourth TFT are turned on;
   wherein the anode of the OLED that is connected to the second node selectively receives, through the third TFT, direct application of the initialization voltage that is connected to the drain of the third TFT thereto when the third TFT is turned on.

2. The AMOLED pixel driver circuit as claimed in claim 1, wherein the first TFT, the second TFT, the third TFT, the fourth TFT and the fifth TFT are all of the same type, that is, either N-type TFTs or P-type TFTs; the light-emitting control signal is a first inverted scan signal, the first inverted scan signal and the first scan signal have opposite phases.

3. The AMOLED pixel driver circuit as claimed in claim 1, wherein the first TFT, the second TFT, the third TFT and the fourth TFT are all of the same type, that is, either N-type TFTs or P-type TFTs, while the fifth TFT is of a different type from the first, second, third and fourth TFTs, i.e., P-type or N-type; and the light-emitting control signal is the first inverted scan signal.

4. The AMOLED pixel driver circuit as claimed in claim 1, wherein the driving timing sequences of the AMOLED pixel driver circuit comprises: an initialization phase, a threshold voltage compensation phase and a light-emitting phase.

5. The AMOLED pixel driver circuit as claimed in claim 4, wherein:
   in the initialization phase, the first scan signal turns on the second TFT and the fourth TFT, the light-emitting control signal cuts off the fifth TFT, and the second scan signal turns on the third TFT;
   in the threshold voltage compensation phase, the first scan signal turns on the second TFT and the fourth TFT, the light-emitting control signal cuts off the fifth TFT, and the second scan signal cuts off the third TFT;
   in the light-emitting phase, the first scan signal cuts off the second TFT and the fourth TFT, the light-emitting control signal turns on the fifth TFT, and the second scan signal cuts off the third TFT.

6. The AMOLED pixel driver circuit as claimed in claim 1, wherein the first TFT, the second TFT, the third TFT, the fourth TFT and the fifth TFT are all low temperature polysilicon (LTPS) TFTs, oxide semiconductor TFTs or amorphous silicon (a-Si) TFTs.

7. An active matrix organic light-emitting diode (AMOLED) pixel driving method, which comprises:
   Step 1: providing an AMOLED pixel driver circuit, comprising: a first thin film transistor (TFT), a second TFT, a third TFT, a fourth TFT, a fifth TFT, a capacitor, and an organic light-emitting diode (OLED);
   the first TFT having the gate connected to a first node, the source connected to positive voltage of a power supply and the drain connected to a second node;
   the second TFT having the gate connected to a first scan signal, the source connected to a reference voltage and the drain connected to a third node;
   the third TFT having the gate connected to a second scan signal, the source connected to the second node and the drain connected to an initialization voltage;
   the fourth TFT having the gate connected to the first scan signal, the source connected to a data signal and the drain connected to the first node;
   the capacitor having one end connected to the third node and the other end connected to the second node;
   the OLED having the anode connected to the second node and the cathode connected to negative terminal of the power supply;
   the fifth TFT having the gate connected to a light-emitting control signal, the source connected to the first node and the drain connected to the third node;

Step 2: entering initialization phase: the first scan signal turning on the second TFT and the fourth TFT, the light-emitting control signal cutting off the fifth TFT, and the second scan signal turning on the third TFT, the data signal being written into the first node, the initialization signal being written into the second node, and the reference voltage being written into the third node, wherein the initialization signal that is written into the second node is directly applied to the anode of the OLED;

Step 3: entering threshold voltage detection phase, the first scan signal turning on the second TFT and the fourth TFT, the light-emitting control signal cutting off the fifth TFT, and the second scan signal cutting off the third TFT, the first node remaining at the data signal voltage, the second node changing to the voltage difference between the data signal and the threshold voltage of the first TFT, the third node remaining at the reference voltage, and the two ends of the capacitor storing the voltage difference between the reference voltage and the second node;

Step 4: entering threshold voltage compensation phase, the first scan signal cutting off the second TFT and the fourth TFT, the light-emitting control signal turning on the fifth TFT, and the second scan signal cutting off the third TFT, the first node and the third node being connected, the voltage between the two ends of the capacitor remaining unchanged, the OLED emitting light and the current flowing through the OLED being independent of the threshold voltage of the first TFT, the threshold voltage of the OLED and the negative voltage of the power source.

8. The AMOLED pixel driving method as claimed in claim 7, wherein the first TFT, the second TFT, the third TFT, the fourth TFT and the fifth TFT are all of the same type, that is, either N-type TFTs or P-type TFTs; the light-emitting control signal is a first inverted scan signal, the first inverted scan signal and the first scan signal have opposite phases.

9. The AMOLED pixel driving method as claimed in claim 7, wherein the first TFT, the second TFT, the third TFT and the fourth TFT are all of the same type, that is, either N-type TFTs or P-type TFTs, while the fifth TFT is of a different type from the first, second, third and fourth TFTs, i.e., P-type or N-type; and the light-emitting control signal is the first inverted scan signal.

10. The AMOLED pixel driving method as claimed in claim 7, wherein the first TFT, the second TFT, the third TFT, the fourth TFT and the fifth TFT are all low temperature polysilicon (LTPS) TFTs, oxide semiconductor TFTs or amorphous silicon (a-Si) TFTs.

11. An active matrix organic light-emitting diode (AMOLED) pixel driver circuit, which comprises: a first thin film transistor (TFT), a second TFT, a third TFT, a fourth TFT, a fifth TFT, a capacitor, and an organic light-emitting diode (OLED);

the first TFT having the gate connected to a first node, the source connected to positive voltage of a power supply and the drain connected to a second node;

the second TFT having the gate connected to a first scan signal, the source connected to a reference voltage and the drain connected to a third node;

the third TFT having the gate connected to a second scan signal, the source connected to the second node and the drain connected to an initialization voltage;

the fourth TFT having the gate connected to the first scan signal, the source connected to a data signal and the drain connected to the first node;

the capacitor having one end connected to the third node and the other end connected to the second node;

the OLED having the anode connected to the second node and the cathode connected to negative terminal of the power supply;

the fifth TFT having the gate connected to a light-emitting control signal, the source connected to the first node and the drain connected to the third node;

wherein when the fifth TFT is turned on, the second TFT and the fourth TFT are cut off; and when the fifth TFT is cut off, the second TFT and the fourth TFT are turned on;

wherein the anode of the OLED that is connected to the second node selectively receives, through the third TFT, direct application of the initialization voltage that is connected to the drain of the third TFT thereto when the third TFT is turned on;

wherein the driving timing sequences of the AMOLED pixel driver circuit-comprises: an initialization phase, a threshold voltage compensation phase and a light-emitting phase; and wherein the first TFT, the second TFT, the third TFT, the fourth TFT and the fifth TFT are all low temperature polysilicon (LTPS) TFTs, oxide semiconductor TFTs or amorphous silicon (a-Si) TFTs.

12. The AMOLED pixel driver circuit as claimed in claim 11, wherein the first TFT, the second TFT, the third TFT, the fourth TFT and the fifth TFT are all of the same type, that is, either N-type TFTs or P-type TFTs; the light-emitting control signal is a first inverted scan signal, the first inverted scan signal and the first scan signal have opposite phases.

13. The AMOLED pixel driver circuit as claimed in claim 11, wherein the first TFT, the second TFT, the third TFT and the fourth TFT are all of the same type, that is, either N-type TFTs or P-type TFTs, while the fifth TFT is of a different type from the first, second, third and fourth TFTs, i.e., P-type or N-type; and the light-emitting control signal is the first inverted scan signal.

14. The AMOLED pixel driver circuit as claimed in claim 11, wherein:

in the initialization phase, the first scan signal turns on the second TFT and the fourth TFT, the light-emitting control signal cuts off the fifth TFT, and the second scan signal turns on the third TFT;

in the threshold voltage compensation phase, the first scan signal turns on the second TFT and the fourth TFT, the light-emitting control signal cuts off the fifth TFT, and the second scan signal cuts off the third TFT;

in the light-emitting phase, the first scan signal cuts off the second TFT and the fourth TFT, the light-emitting control signal turns on the fifth TFT, and the second scan signal cuts off the third TFT.

* * * * *